(12) United States Patent
Kinsman et al.

(10) Patent No.: US 6,455,351 B2
(45) Date of Patent: *Sep. 24, 2002

(54) VERTICAL SURFACE MOUNT ASSEMBLY AND METHODS

(75) Inventors: Larry D. Kinsman, Boise; Jerry M. Brooks, Caldwell; Warren M. Farnworth, Nampa; Walter L. Moden, Meridian; Terry R. Lee, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/819,297

(22) Filed: Mar. 27, 2001

Related U.S. Application Data (60) Continuation of application No. 09/505,214, filed on Feb. 16, 2000, which is a division of application No. 09/050,588, filed on Mar. 30, 1998, now Pat. No. 6,087,723.

(51) Int. Cl.[7] .............................................. H01L 21/44
(52) U.S. Cl. ...................................... 438/107; 257/727
(58) Field of Search ........................... 438/107; 257/727

(56) References Cited

U.S. PATENT DOCUMENTS

| | | |
|---|---|---|
| 4,582,386 A | 4/1986 | Martens |
| 4,781,612 A | 11/1988 | Thrush |
| 4,995,825 A | 2/1991 | Korsunsky et al. |
| 5,209,675 A | 5/1993 | Korsunsky |
| 5,244,403 A | 9/1993 | Smith et al. |
| 5,256,078 A | 10/1993 | Lwee et al. |
| 5,266,833 A | 11/1993 | Capps |
| RE34,794 E | 11/1994 | Farnworth |
| 5,444,304 A | 8/1995 | Hara et al. |
| 5,449,297 A | 9/1995 | Bellomo et al. |
| 5,450,289 A | 9/1995 | Kweon et al. |
| 5,451,815 A | 9/1995 | Taniguchi et al. |
| 5,592,019 A | 1/1997 | Ueda et al. |
| 5,635,760 A | 6/1997 | Ishikawa |
| 5,668,409 A | 9/1997 | Gaul |
| 5,821,615 A | 10/1998 | Lee |
| 6,010,920 A | 1/2000 | Hellgren et al. |

*Primary Examiner*—Douglas A. Wille
(74) *Attorney, Agent, or Firm*—TraskBritt

(57) ABSTRACT

A vertically mountable semiconductor device assembly including a semiconductor device and a mechanism for attaching the semiconductor device to a carrier substrate. The semiconductor device has each of its bond pads disposed proximate a single edge thereof. Preferable, at least a portion of the semiconductor device is exposed. An alignment device is attached to a carrier substrate. A mounting element on the vertically mountable semiconductor device package engages the alignment device to interconnect the semiconductor device and the alignment device. Preferably, the alignment device secures the vertically mountable semiconductor device package perpendicular relative to the carrier substrate. The distance between the bond pads and corresponding terminals on the carrier substrate is very small in order to reduce impedance. The vertically mountable semiconductor device package may also be readily user-upgradable.

21 Claims, 6 Drawing Sheets

VERTICAL SURFACE MOUNT ASSEMBLY AND METHODS

CROSS-REFERENCE TO RELATED APPLICATIONS

This application is a continuation of application Ser. No. 09/505,214, filed Feb. 16, 2000, now U.S. Pat. No. 6,228,677 B1, issued May 8, 2001, which is a divisional of application Ser. No. 09/050,588, filed Mar. 30, 1998, now U.S. Pat. No. 6,087,723, issued Jul. 11, 2000.

BACKGROUND OF THE INVENTION

1. Field of the Invention

The present invention relates to vertically mountable semiconductor device packages. More specifically, the present invention relates to minimally packaged semiconductor devices which are vertically attached to a carrier substrate. Preferably, the present invention also relates to user-upgradable surface mount packages.

2. Background of Related Art

Vertical surface mount packages are known in the art. When compared with traditional, horizontally mountable semiconductor device packages and horizontally oriented multi-chip packages, many vertical surface mount packages consume less area on a circuit board or other carrier substrate than a horizontally mounted package of the same size. Many vertical surface mount packages may also have a superior ability to transfer heat than conventional horizontally mountable semiconductor device packages and horizontally oriented multi-chip packages. Thus, the semiconductor industry is finding that vertical surface mount packages offer advantages over their traditional, horizontally mountable counterparts. Various vertical surface mount packages are disclosed in U.S. Pat. No. Re. 34,794 (the "'794 patent"), issued to Warren M. Farnworth on Nov. 22, 1994; U.S. Pat. No. 5,444,304 (the "'304 patent"), issued to Kouija Hara and Jun Tanabe on Aug. 22, 1995; U.S. Pat. No. 5,450,289, issued to Yooung D. Kweon and Min C. An on Sep. 12, 1995; U.S. Pat. No. 5,451,815, issued to Norio Taniguchi et al. on Sep. 19, 1995; U.S. Pat. No. 5,592,019, issued to Tetsuya Ueda et al. on Jan. 7, 1997; and U.S. Pat. No. 5,635,760, issued to Toru Ishikawa on Jun. 3, 1997.

Some designs of vertical surface mount packages include wire bonded leads to operatively connect a semiconductor device to a circuit board which tend to increase the inductance and decrease the overall speed with which the device conducts electrical signals. The use of permanent wire bonds is necessary to electrically connect many such semiconductor devices to the circuit boards while the semiconductor devices are typically adhesively attached to the circuit board to be supported thereon, thereby preventing the vertical surface mount package from being readily user-upgradable.

Electrical connections may also be made between many types of electronic devices and a circuit board by means of sockets. For example, sockets are commonly employed to establish and maintain an electrical connection between a mother board and a daughter board, such as a single in-line memory module (SIMM). Exemplary devices are found in the following U.S. Pat. No. 4,781,612, issued to Roger L. Thrush on Nov. 1, 1998; U.S. Pat. No. 4,995,825, issued to Iosif Korsunsky et al. on Feb. 26, 1991; U.S. Pat. No. 5,209,675, issued to Iosif Korsunsky on May 11, 1993; U.S. Pat. No. 5,244,403, issued to Gregory J. Smith et al. on Sep. 14, 1993; and U.S. Pat. No. 5,256,078, issued to Nai H. Lwee and David J. Dutkowsky on Oct. 26, 1993. Each of the foregoing patents discloses the use of contacts within the socket which resiliently engage contacts on the daughter board to establish an electrical connection between the daughter board and the mother board.

However, none of those devices disclose the use of a socket for removably mounting a minimally packaged semiconductor device to a circuit board. The circuitry of a daughter board and the typical use of wire bonding to attach a semiconductor device thereto each tend to increase the inductance of such devices. Some socket-mountable daughter boards include more than one semiconductor device permanently attached thereto. Thus, such devices are not readily user-upgradable.

What is needed is a low impedance, vertically mountable semiconductor device package which has improved heat transferability and is readily user-upgradable.

SUMMARY OF THE INVENTION

The vertically mountable semiconductor device assembly of the present invention includes a semiconductor device, a retainer which engages the semiconductor device and a mounting element. The vertically mountable semiconductor device assembly of the present invention also includes an alignment device. The alignment device facilitates attachment of bond pads on the semiconductor device to their corresponding terminals on a carrier substrate.

The alignment device may include contacts to electrically connect a bond pad on the semiconductor device to a corresponding terminal on a carrier substrate. Alternatively, the bond pads may directly contact their corresponding terminals on a carrier substrate. Thus, as the mounting element is attached to the alignment device, an electrical connection is established between the semiconductor device and the carrier substrate.

The mounting element may include two downwardly extending clips, which flex outward during installation of the package onto the alignment device. The clips spring back to their relaxed position as they engage recessed areas of the alignment device. Removal of the vertically mountable semiconductor device package from the alignment device requires a slight outward flexion of the clips, such that they release the alignment device and may be moved upward relative thereto.

The present invention also includes a method of manufacturing the vertically mountable semiconductor device assembly and methods of designing and fabricating a semiconductor device that is useful in the vertically mountable semiconductor device assembly of the present invention. A computer which includes the vertically mountable semiconductor device package and assembly is also within the scope of the present invention.

Advantages of the present invention will become apparent to those of ordinary skill in the relevant art through a consideration of the appended drawings and the ensuing description.

DETAILED DESCRIPTION OF THE INVENTION

Figure 1:
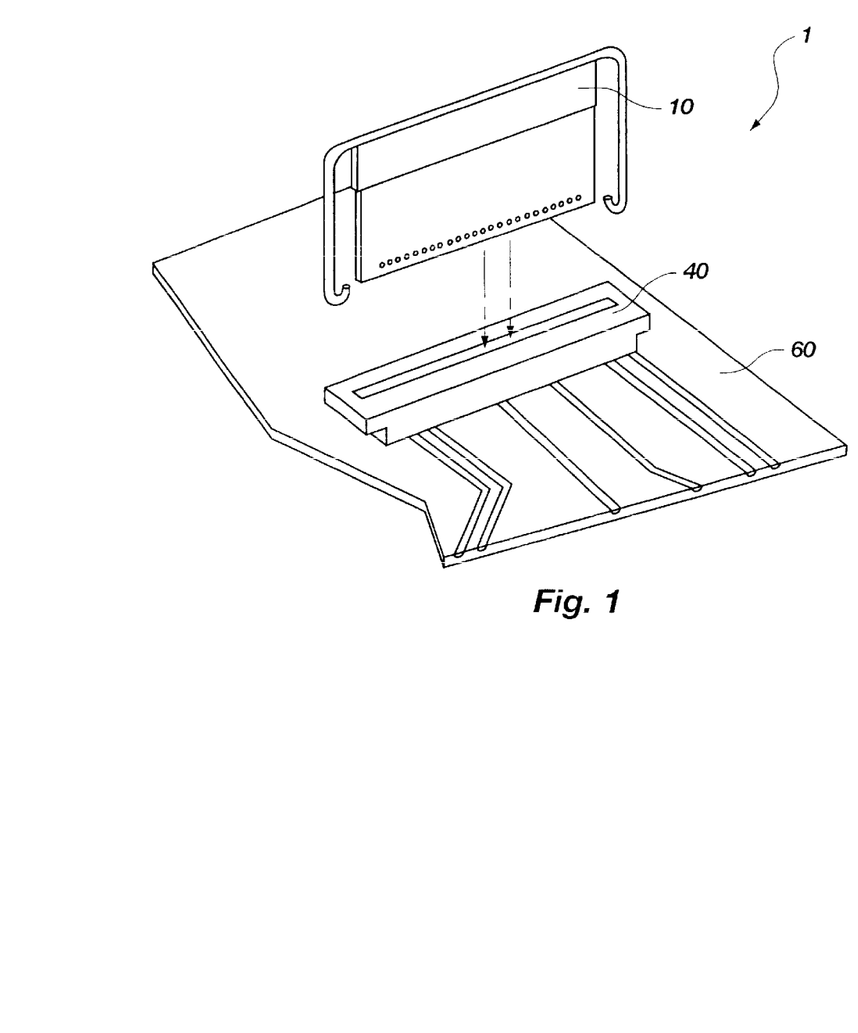
FIG. 1 is a perspective assembly view of a first embodiment of the vertically mountable semiconductor device assembly according to the present invention.

FIG. 1 shows a preferred embodiment of a vertically mountable semiconductor device assembly 1 according to the present invention including a semiconductor device package 10 and alignment device 40. Alignment device 40 is mountable to a carrier substrate 60 and establishes electrical contact therewith. Vertically mountable semiconductor device package 10 engages alignment device 40 to communicate electrically with carrier substrate 60.

Figure 2:
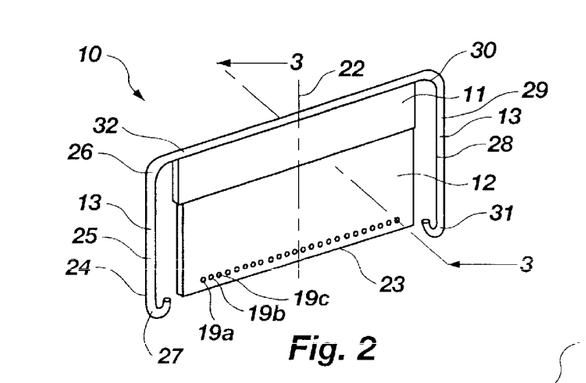
FIG. 2 is a frontal perspective view of the vertically mountable semiconductor device package of FIG. 1, showing a preferred embodiment of a semiconductor device that is useful therein.
Figure 3:
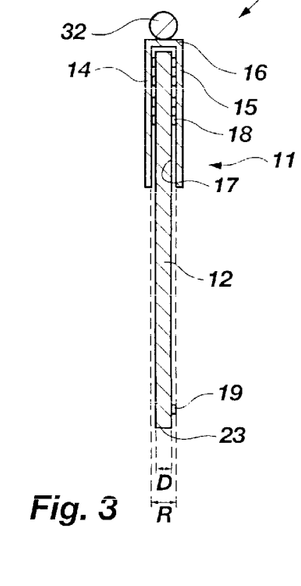
FIG. 3 is a cross-section taken along line 3—3 of FIG. 2.

With reference now to FIGS. 2 and 3, a first embodiment of vertically mountable semiconductor device package 10 includes a retainer 11 and a semiconductor device 12 attached to the retainer. Vertically mountable semiconductor device package 10 also includes a mounting element 13, which extends downward from retainer 11.

Retainer 11 is an elongate member having a generally U-shaped cross-section with two substantially parallel arms 14 and 15, a joining component 16 disposed between the arms, and a receptacle 17 formed by the arms and the joining component. Arms 14 and 15 are laterally spaced from one another a distance of R, which is slightly larger than the cross-sectional thickness of the semiconductor device 12 to be inserted therein, referred to as distance D. Thus, semiconductor device 12 may be inserted into receptacle 17. Preferably, the difference between D and R is sufficient to prevent damage to semiconductor device 12 during its insertion into receptacle 17, but small enough to create a sufficiently tight fit to restrict side-to-side movement of the semiconductor device relative to retainer 11.

In the present embodiment of vertically mountable semiconductor device package 10, semiconductor device 12 is held within receptacle 17 by a securing mechanism 18. Preferably, securing mechanism 18 holds semiconductor device 12 within retainer 11 in a manner which maintains the semiconductor device's position relative to the retainer (i.e., fixedly secures the semiconductor device within the retainer). Thus, securing mechanism 18 maintains the alignment of bond pads 19a, 19b, 19c, etc. relative to their corresponding contacts (reference character 44 of FIGS. 8, 11a and 11b) in the alignment device during repeated removal and reinstallation of vertically mountable semiconductor device package 10 relative to same.

Securing mechanism 18 includes an adhesive material, which holds semiconductor device 12 permanently in place. A preferred adhesive material is compliant under stress, is an electrical insulator, withstands the high temperatures generated by the semiconductor device during operation, does not tend to flow at high temperatures, and has primarily vapor degradative by-products. Such adhesive materials include, but are not limited to, room temperature vulcanizing (RTV) silicones, other silicone gels, and other high melt point thermoplastics. Other adhesives such as epoxies, acrylics and others are also useful in the present invention as securing mechanism 18. Other embodiments of securing mechanism 18 are also useful in the retainer of the present invention, including, without limitation, an interference fit between semiconductor device 12 and receptacle 17, a clipping mechanism within the receptacle, and others.

Figure 4:
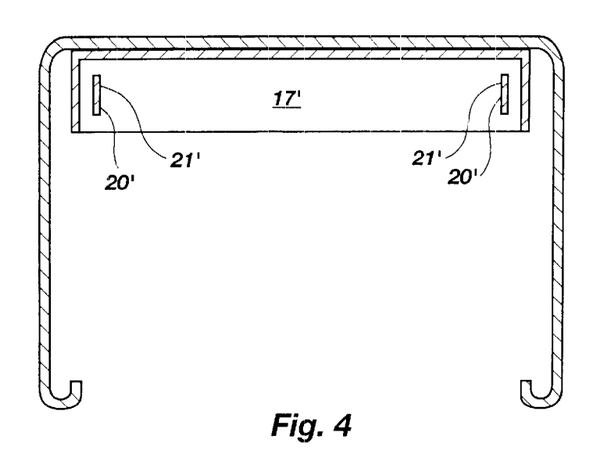
FIG. 4 is a cross-sectional view of an embodiment of a die receptacle which includes a first embodiment of an alignment mechanism.

The length of receptacle 17 is approximately equal to the width of semiconductor device 12. Thus, as semiconductor device 12 is inserted into receptacle 17, lateral movement of the semiconductor device is restricted. With reference to FIG. 4, an alternative embodiment of receptacle 17' may include an alignment mechanism 20', which orients a semiconductor device 12 in a manner that aligns bond pads 19a, 19b, 19c, etc. relative to their corresponding contacts 44 (see FIG. 8) of the alignment device 40 (see FIG. 8). One configuration of alignment mechanism 20' includes one or more raised guides 21' within receptacle 17', which direct the lateral orientation of semiconductor device 12 relative to the receptacle.

Alternatively, referring again to FIGS. 2 and 3, during packaging, semiconductor device 12 may be laterally oriented within receptacle 17 in such a manner that bond pads 19a, 19b, 19c, etc. are positioned relative to a center line 22 of vertically mountable semiconductor device package 10. Other alignment landmarks on vertically mountable semiconductor device package 10, such as the sides of retainer 11 or the location of mounting element 13, may also be used to orient bond pads 19a, 19b, 19c, etc. relative to the remainder of the vertically mountable semiconductor device package in a manner which aligns the bond pads with their corresponding contacts.

Semiconductor device 12 is a semiconductor device of the type known and used in the industry. However, the bond pads 19a, 19b, 19c, etc. of semiconductor device 12 are disposed proximal to a single edge 23 thereof. Thus, during fabrication of semiconductor device 12, bond pads 19a, 19b, 19c, etc. are redirected to a location which is adjacent to edge 23. Methods and mechanisms which are known to those of ordinary skill in the art are useful for manufacturing semiconductor devices which are useful in the vertically mountable semiconductor device package according to the present invention. Such methods include the fabrication of electrical traces which lead to edge 23 and the fabrication of bond pads 19a, 19b, 19c, etc. adjacent to edge 23. Bond pads 19 may have a thickness that is greater than that of the bond pads of conventional semiconductor devices. Alternatively, bond pads 19 may be fabricated from a mechanically durable, electrically conductive material. Preferably, the fabrication steps which precede the fabrication of the electrical traces that lead to bond pads 19a, 19b, 19c, etc. and the fabrication of the bond pads are unchanged from their equivalent steps in the fabrication of prior art semiconductor devices. Thus, existing semiconductor designs are useful in the vertically mountable semiconductor device package of the present invention with little modification.

Figure 5:
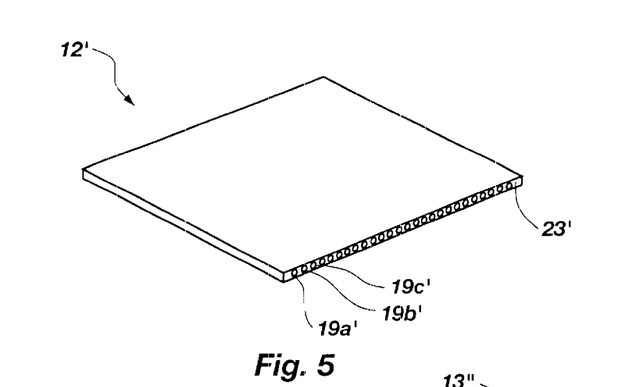
FIG. 5 is a frontal perspective view of a second embodiment of a semiconductor device which is useful in the assembly.

FIG. 5 illustrates an alternative embodiment of the semiconductor device 12', which includes bond pads 19a', 19b', 19c', etc. that are disposed on an edge 23'. U.S. Pat. No. 5,266,833, issued to David F. Capps on Nov. 30, 1993, and U.S. Pat. No. 5,668,409, issued to Stephen Joseph Gaul on Sep. 16, 1997, the disclosures of each of which are hereby incorporated by reference, disclose processes for manufacturing such semiconductor devices.

Referring again to FIGS. 2 and 3, a preferred semiconductor device 12 has a standardized number of bond pads 19a, 19b, 19c, etc., which are spaced apart from one another at a standardized pitch, and which may be positioned at a specific location relative to center line 22 of vertically mountable semiconductor device package 10, or relative to any other landmark on the vertically mountable semiconductor device package, such as a side thereof or mounting element 13. The placement of bond pads 19a, 19b, 19c, etc. proximal to edge 23 imparts vertically mountable semiconductor device package 10 with reduced inductance as the bond pads are electrically connected to carrier substrate 60, relative to many vertical surface mount packages and other packaged semiconductor devices in the prior art.

With continued reference to FIGS. 2 and 3, a first embodiment of mounting element 13 includes clips 24 and 28, which extend downward from opposite ends of retainer 11. Clips 24 and 28 each have a curvilinear shape, which includes a long straight member 25 and 29 having a first end 26 and 30 and a second end 27 and 31, respectively. First end 26, 30 rigidly attaches to retainer 11. The opposite, second end 27, 31 of clips 24 and 28 is curved, and is also referred to as the alignment device receiving end. Alignment device receiving end 27, 31 is curved inward relative to vertically mountable semiconductor device package 10, such that it is adapted to engage a slot (reference characters 50 and 53 of FIG. 7) of alignment device 40, described in further detail below. Preferably, clips 24 and 28 are continuous with one another and are joined by a center element 32 which extends across retainer 11.

Clips 24 and 28 align semiconductor device 12 and its bond pads 19a, 19b, 19c, etc. vertically with respect to the alignment device (reference character 40 of FIG. 1) (i.e., along the alignment device's z-axis). Thus, the preferred length of clips 24 and 28, and their orientation relative to retainer 11, are dependent upon the height of semiconductor device 12 and the location of bond pads 19a, 19b, 19c, etc. relative to edge 23.

Preferably, clips 24 and 28 are manufactured from a substantially rigid material which has good thermal conductivity and which tends to rebound to its original shape following the release of a bending stress. Materials including, without limitation, metals, plastics (especially injection moldable plastics), and fiber-reinforced composite materials are useful for manufacturing clips 24 and 28. Metals such as steel and aluminum are preferred due to their rigidity and their shape retention as load is placed thereon. Clip 24 and/or 28 may be employed as an electrical ground or to protect semiconductor device 12 from electrostatic discharge.

Figure 6A:
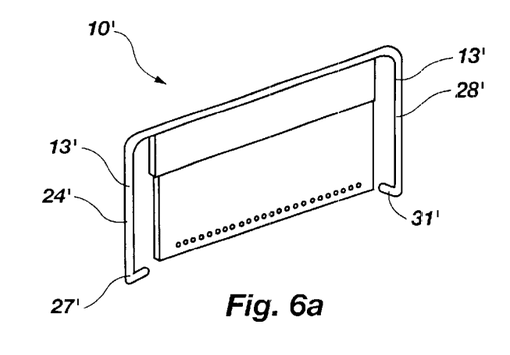
FIGS. 6a and 6b are each frontal perspective views of second and third embodiments of the vertically mountable semiconductor device package, illustrating different mounting elements.
Figure 6B:
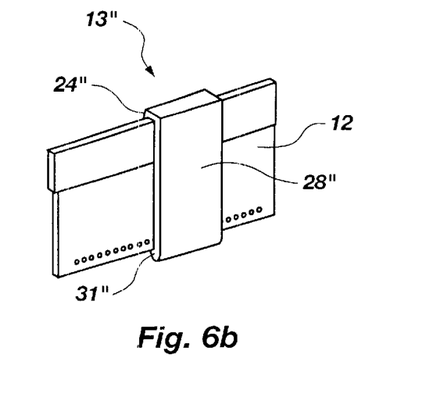

Alternative embodiments of the mounting element, examples of which are illustrated in FIGS. 6a and 6b, are also within the scope of the present invention. Referring to FIG. 6a, a second embodiment of the mounting element 13' is shown. Mounting element 13' includes clips 24' and 28' extending downwardly from the ends of vertically mountable semiconductor device package 10'. Each of clips 24' and 28' includes a V-shaped alignment device receiving end 27' and 31', respectively. Alignment device receiving ends 27' and 31' are adapted to engage a corresponding engagement mechanism on the alignment device 40 (see FIG. 1).

With reference to FIG. 6b, a third embodiment of the mounting element 13" includes clips 24" and 28", which extend over major surfaces of semiconductor device 12. Each of clips 24" and 28" has an alignment device receiving end 27" (not shown) and 31", respectively, which is adapted to engage a corresponding receiving mechanism on the alignment device (shown in FIG. 9).

Figure 7:
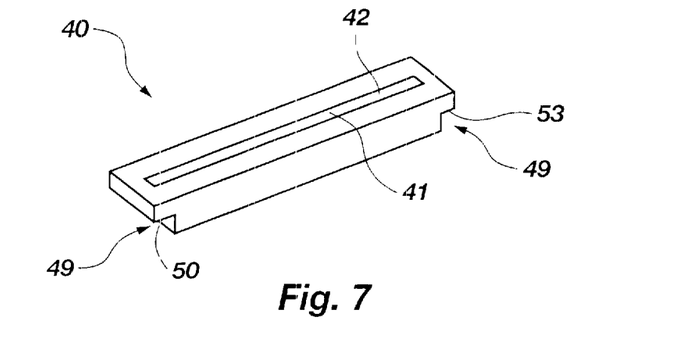
FIG. 7 is a frontal perspective view of the first embodiment of the alignment device of FIG. 1.
Figure 8:
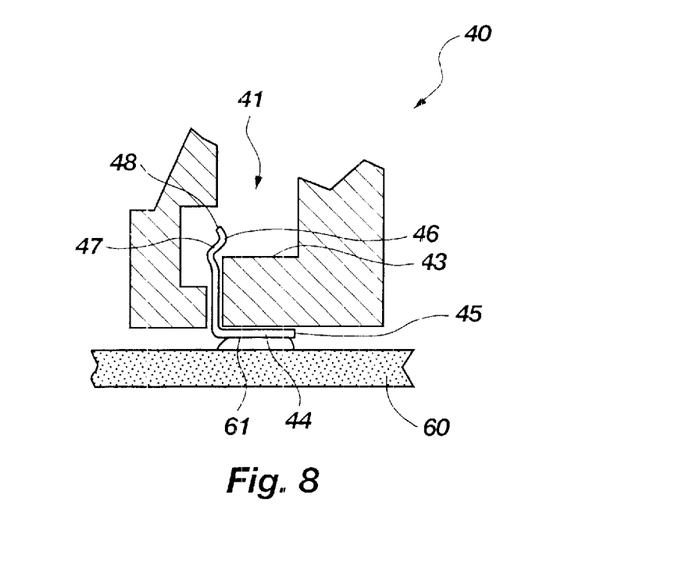
FIG. 8 is a side plan view of an embodiment of a contact that is useful in the alignment device of FIG. 1.

FIGS. 7 and 8 show an alignment device 40, which is an elongate member including a body which defines an elongated interconnection receptacle 41 formed in the top surface thereof and extending downwardly therein. Interconnection receptacle 41 has an upper end 42, which receives a semiconductor device 12 (see FIG. 1), and a lower end 43. Lower end 43 includes contacts 44 therein. As alignment device 40 is mounted to carrier substrate 60, the contacts are electrically connected to their corresponding terminals 61 on carrier substrate 60.

Alignment device 40 is preferably fixedly attached to carrier substrate 60. Mechanisms which are known in the art are useful for attaching alignment device 40 to carrier substrate 60. Such mechanisms include, without limitation, screws, protrusions which extend into or through the carrier substrate, adhesives and solders.

FIG. 8 illustrates an embodiment of a contact 44, which includes a terminal contact end 45 and a bond pad contact end 46. Terminal contact end 45 is electrically connected with its respective terminal 61 by methods which are known in the industry, including, without limitation, soldering, the use of Z-axis tape, and the use of an interference fit. Preferably, terminal contact end 45 of contact 44 is maintained in a fixed position relative to terminal 61.

A spring arm 47, located between terminal contact end 45 and bond pad contact end 46, facilitates movement of the bond pad contact end relative to the substrate contact end as a semiconductor device 12 (see FIG. 1) is inserted into interconnection receptacle 41. Preferably, while subjected to a bending force, spring arm 47 exerts an opposite reactive (i.e., spring) force, such that bond pad contact end 46 snugly abuts its corresponding bond pad 19 (see FIGS. 2 and 3). Thus, spring arm 47 creates an interference contact between contact 44 and bond pad 19 (see FIGS. 2 and 3).

Preferably, the end of bond pad contact end 46 is bent outwardly to form an outward extension 48. Outward extension 48 facilitates movement of bond pad contact end 46 as a semiconductor device 12 (see FIG. 1) is inserted into interconnection receptacle 41. Preferably, the shape of outward extension 48 also prevents damage to semiconductor device 12 during its insertion into interconnection receptacle 41.

Contacts 44 have a length of about 1½ mm (about 60 mils) or less. More preferably, contacts 44 are about 1 mm (about 40 mils) long or shorter. As those in the art are aware, longer contacts create greater inductance. Thus, less parasitic inductance and capacitance are generated by shorter contacts 44. The total length of contacts 44 depends on the thickness of the base of the alignment device, the circuit length required to establish an electrical connection with terminal 61 on carrier substrate 60 (see FIG. 7), and the circuit length required to establish an electrical connection with bond pads 19 of semiconductor device 12 (see FIGS. 2 and 3).

Referring again to FIG. 7, a preferred embodiment of alignment device 40 also includes a mounting element engager 49. A preferred mounting element engager 49 includes two downward-facing slots 50 and 53 formed in opposite ends of alignment device 40. Sides align a semiconductor device 12 (see FIG. 1) relative to the y-axis of alignment device 40. In the present embodiment, the ends of alignment device 40 align the semiconductor device 12 relative to the alignment device's X-axis. As will become apparent, alternative embodiments of mounting element engager 49 may be formed within interconnection receptacle 41, on carrier substrate 60, through the carrier substrate, or elsewhere upon or in proximity to alignment device 40.

Figure 9:
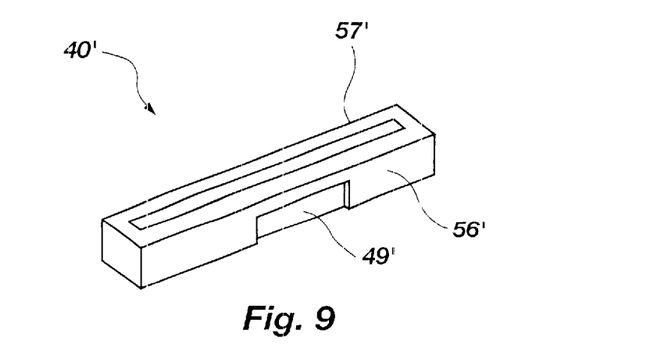
FIG. 9 is a frontal perspective view of an alignment device having a second embodiment of the mounting element engager.

Mounting element engager 49 may include any other mechanism which will support the semiconductor device and align the semiconductor device with respect to each of the alignment device's x-, y- and z-axes. FIG. 9 illustrates an alignment device 40' having a variation 49' of the mounting element engager, which is formed in the front 56' and back 57' sides of alignment device 40'. Mounting element engager 49' is adapted to receive a corresponding mounting element 13" of the vertically mountable semiconductor device package, such as clips 24" and 28", described above in reference to FIG. 6b.

Figure 10A:
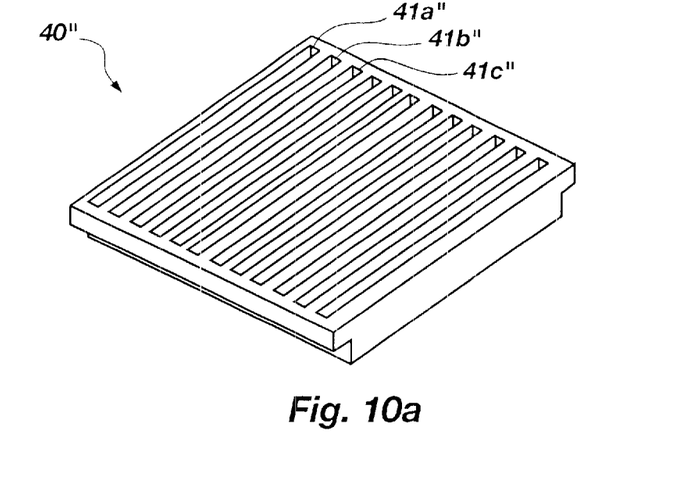
FIG. 10a is a frontal perspective view of a second embodiment of the alignment device.

With reference to FIG. 10a, a third embodiment 40" of an alignment device according to the present invention may include a plurality of interconnection receptacles 41a", 41b", 41c", etc. Thus, alignment device 40" receives one or more vertically mountable semiconductor device packages 10 (see FIG. 1).

Figure 10B:
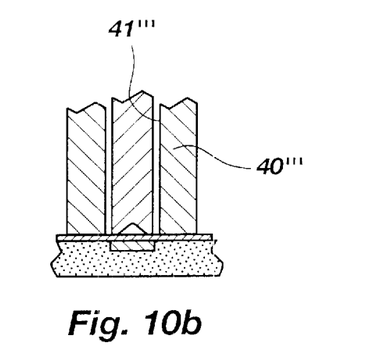
FIG. 10b is a cross-sectional view of a third embodiment of the alignment device.

FIG. 10b illustrates a fourth embodiment of the alignment device 40'", wherein an interconnection receptacle 41'" opens to both the top and bottom surfaces thereof. Alignment device 40'" is useful with a semiconductor device having bond pads on the edge thereof, such as that disclosed above in reference to FIG. 5. Similarly, other embodiments of alignment device 40'" are also contemplated to be useful in the assembly of the present invention and, thus, within the scope of the present invention.

Figure 10C:
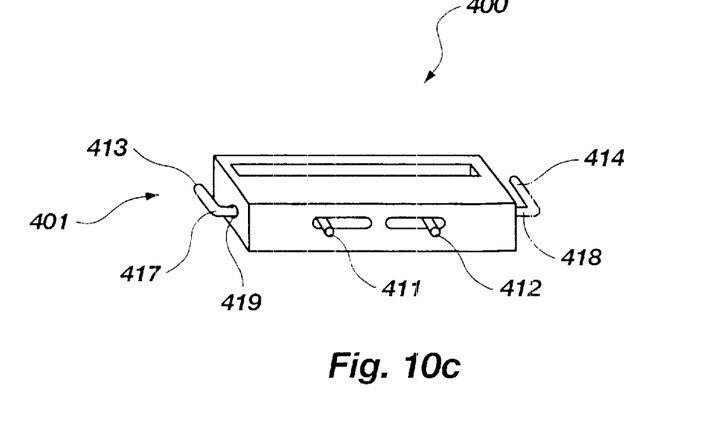
FIG. 10c is a cross-sectional view of a fourth embodiment of the alignment device.

In an alternative embodiment of the alignment device 400, the mounting element engager 401 may also include a semiconductor engagement mechanism. FIG. 10c shows a preferred embodiment of such a mechanism wherein actuators 411 and 412 actuate corresponding engagement pins 413 and 414 which engage the clips of the vertically mountable semiconductor device package (not shown). As actuators 411 and 412 are moved toward the center of alignment device 400, arms 417 and 418 are slid along engagement slots 419 and 420 (not shown), retracting engagement pins 413 and 414, respectively. While engagement pins 413 and 414 are retracted, the mounting element engager 401 is in a nonengagement state. Thus, the vertically mountable semiconductor device package may be lifted away and disconnected from alignment device 400. Likewise, after the vertically mountable semiconductor device package has been installed on alignment device 400, the movement of actuators 411 and 412 toward the ends of the alignment device causes engagement pins 413 and 414 to engage the clips, adjusting the mounting element engager 401 to an engagement state. Alternatively, the actuator may include a single button, which, when depressed, actuates the retraction of engagement pins, hooks, tabs or any other component which engages the clips of the vertically mountable semiconductor device package to adjust the mounting element engager between an engagement state and a nonengagement state.

Figure 11A:
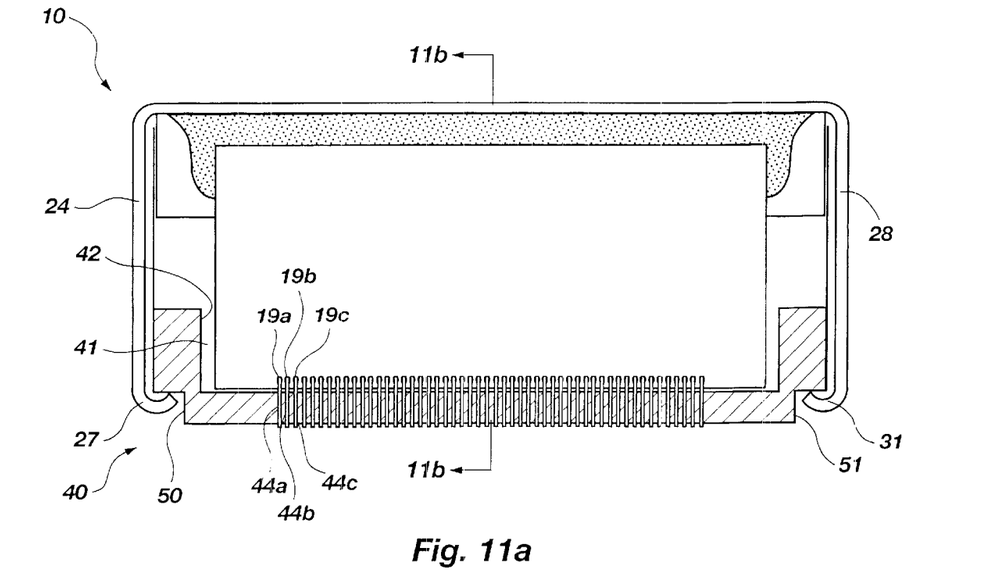
FIGS. 11a and 11b are cross-sectional views illustrating the interconnection of the vertically mountable semiconductor device package with the alignment device.
Figure 11B:
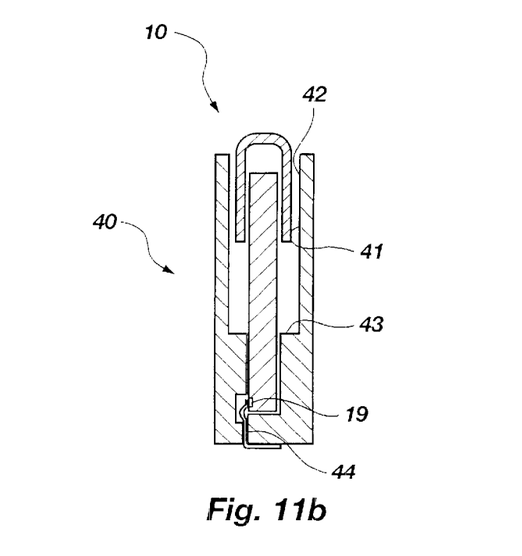

Referring to FIGS. 11a and 11b, as an example of the use of the assembly of the present invention, vertically mountable semiconductor device package 10 is inserted into upper end 42 of interconnection receptacle 41. Clips 24 and 28 flex outward as they contact alignment device 40. As vertically mountable semiconductor device package 10 is moved downward relative to alignment device 40, alignment device receiving ends 27 and 31 of clips 24 and 28, respectively, engage their corresponding slots 50 and 51 on the alignment device. Simultaneously, bond pads 19a, 19b, 19c, etc. establish an electrical connection with their corresponding contacts 44a, 44b, 44c, etc., respectively. Similarly, when the vertically mountable semiconductor device package includes a semiconductor device with bond pads exposed to the edge thereof, as described above in reference to FIGS. 5 and 10b, as the vertically mountable semiconductor device package and alignment device interconnect, bond pads 19 contact terminals 61 or a z-axis film disposed on the terminals to establish a direct electrical connection with the terminals.

Figure 12:
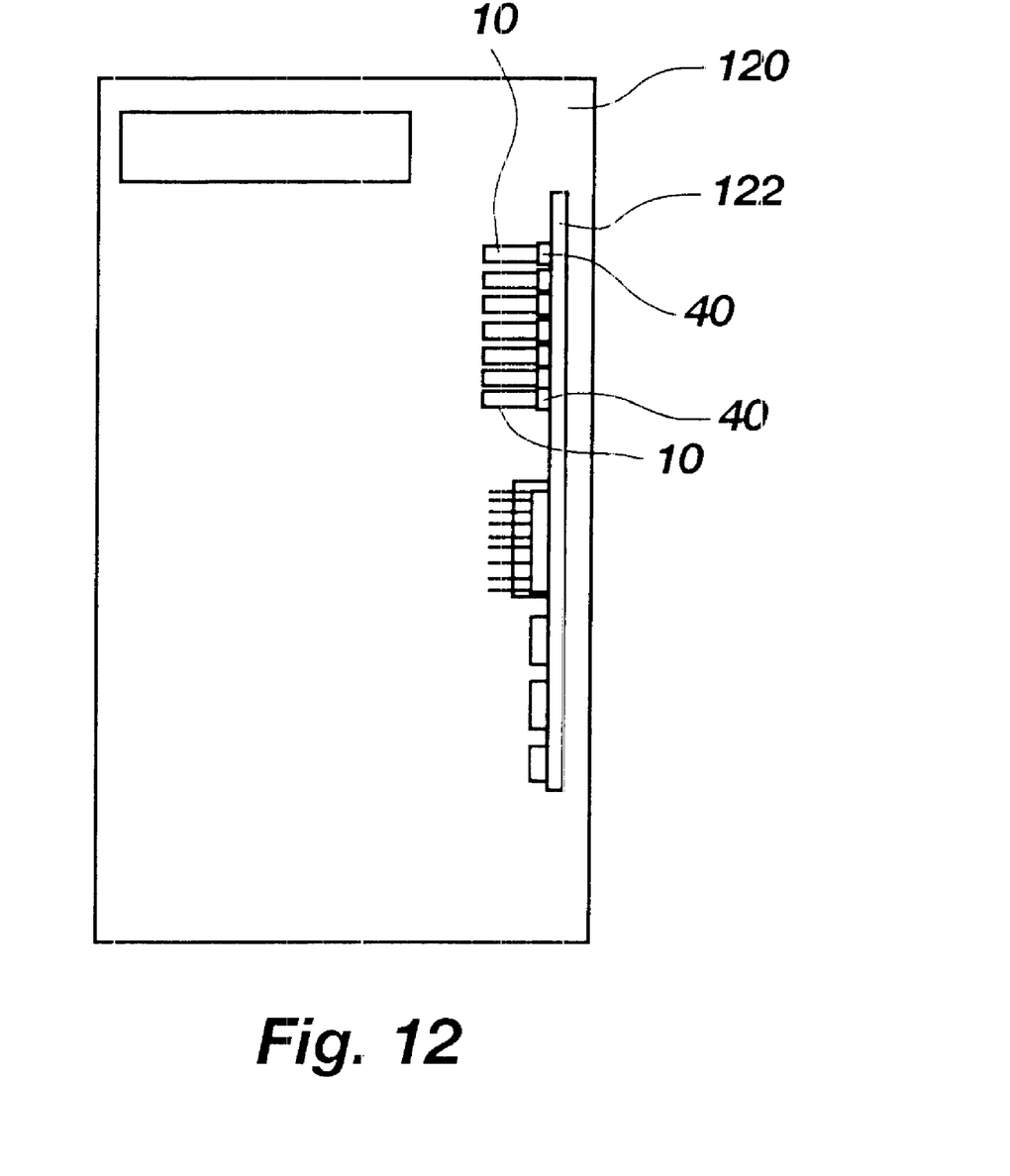
FIG. 12 is a schematic representation of the vertically mountable semiconductor device package in a computer.

FIG. 12 illustrates a computer 120 including a carrier substrate 122. Alignment device 40 attaches to carrier substrate 122. Vertically mountable semiconductor device package 10 is insertable into alignment device 40, which establishes an electrical connection between semiconductor device 12 (see FIG. 1) and carrier substrate 122. Thus, with the attachment of vertically mountable semiconductor device package 10 to carrier substrate 122, semiconductor device 12 is operatively incorporated into computer 120.

The described embodiments of the present invention provide several advantages over devices in the prior art. The vertically mountable semiconductor device package, which includes a mounting element and a retainer that only partially encloses the semiconductor device, is minimal and relatively simple when compared to many vertical surface mount packages and other packaged semiconductor devices in the prior art. Consequently, materials and production costs are decreased. When used in connection with a convection-type air circulation system, such as those that are known and used in the art, heat transfer away from the semiconductor device is also improved over that of vertical surface mount packages in the prior art and other traditionally packaged semiconductor devices.

Advantageously, the vertically mountable semiconductor device package of the present invention is removably attachable to the alignment device. Thus, it is a consequent advantage that the vertically mountable semiconductor device package of the present invention is user-replaceable and user-upgradable. Further, as the mounting element engages the alignment device, the bond pads align with the mounting element engagers.

Moreover, the bond pad placement and relatively short length of the contacts impart the assembly of the present invention with very low impedance.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention indicated by the appended claims and their equivalents.

What is claimed is:

1. A method for connecting at least one semiconductor device to a substrate, comprising:

providing a substrate with an alignment device secured thereto, said alignment device including at least one receptacle configured to receive at least an edge of the at least one semiconductor device; and at least partially inserting the at least one semiconductor device into said at least one receptacle with the at least one semiconductor device oriented in nonparallel relation to said substrate, at least one of the at least one semiconductor device and said alignment device engaging the other of the at least one semiconductor device and said alignment device.

2. The method of claim 1, wherein said at least partially inserting comprises electrically connecting the at least one semiconductor device to said substrate.

3. The method of claim 1, wherein said at least partially inserting comprises biasing at least one contact of said alignment device against a corresponding bond pad of the at least one semiconductor device.

4. The method of claim 1, wherein said at least partially inserting comprises biasing at least one bond pad of the at least one semiconductor device against a corresponding contact pad of said substrate.

5. The method of claim 1, wherein said at least partially inserting includes securing a mounting element of the at least one semiconductor device to at least one corresponding feature of said alignment device.

6. The method of claim 5, wherein said securing said mounting element comprises removably securing the at least one semiconductor device within said at least one receptacle.

7. The method of claim 1, further comprising removing the at least one semiconductor device from said at least one receptacle.

8. The method of claim 7, wherein said removing comprises disengaging a mounting element of the at least one semiconductor device from at least one corresponding feature of said alignment device.

9. A method for connecting at least one semiconductor device to a substrate, comprising:

providing at least one semiconductor device comprising at least one semiconductor die; and inserting at least an edge of said at least one semiconductor device into a receptacle of an alignment device secured to the substrate, said at least one semiconductor device being oriented nonparallel relative to the substrate, at least one element of said at least one semiconductor device engaging a corresponding element of said alignment device.

10. The method of claim 9, wherein said inserting comprises electrically connecting said at least one semiconductor die to the substrate.

11. The method of claim 9, wherein said inserting includes biasing at least one contact of said alignment device against a corresponding contact pad of said at least one semiconductor device.

12. The method of claim 9, wherein said inserting comprises biasing at least one contact pad of said at least one semiconductor device against a corresponding terminal of the substrate.

13. The method of claim 9, wherein said engaging comprises at least partially interconnecting a mounting element of said at least one semiconductor device and a corresponding feature of said alignment device.

14. The method of claim 9, wherein said engaging by said at least one element comprises removably engaging said corresponding element.

15. The method of claim 9, further comprising removing said at least one semiconductor device from said receptacle.

16. The method of claim 15, wherein said removing comprises disengaging said at least one element and said corresponding element.

17. The method of claim 16, wherein said disengaging comprises disengaging a mounting element of said at least one semiconductor device from a corresponding feature of said alignment device.

18. A method for fabricating a semiconductor device package, comprising:

fabricating a semiconductor die including at least one bond pad located adjacent a single edge thereof; and securing to another edge of said semiconductor die an element for securing said semiconductor die in nonparallel relation to a substrate to which said semiconductor die is to be electrically connected.

19. The method of claim 18, wherein said securing comprises securing a mounting element to said another edge.

20. The method of claim 18, wherein said securing comprises securing said element to an edge of said semiconductor die located opposite said single edge.

21. The method of claim 18, wherein said fabricating comprises fabricating a semiconductor die including at least one bond pad located on said single edge.

* * * * *

UNITED STATES PATENT AND TRADEMARK OFFICE
CERTIFICATE OF CORRECTION

PATENT NO. : 6,455,351 B2
DATED : September 24, 2002
INVENTOR(S) : Larry D. Kinsman et al.

It is certified that error appears in the above-identified patent and that said Letters Patent is hereby corrected as shown below:

Title page,
Item [57], ABSTRACT,
Line 5, change "Preferable," to -- Preferably, --

Column 7,
Lines 35, 37 and 40, change "40"" to -- 40'" --
Line 35, change "41"" to -- 41'" --

Signed and Sealed this

Seventh Day of October, 2003

JAMES E. ROGAN
*Director of the United States Patent and Trademark Office*